United States Patent
Lenchenkov

(10) Patent No.: US 9,041,081 B2
(45) Date of Patent: May 26, 2015

(54) IMAGE SENSORS HAVING BURIED LIGHT SHIELDS WITH ANTIREFLECTIVE COATING

(71) Applicant: Semiconductor Components Industries, LLC, Phoenix, AZ (US)

(72) Inventor: Victor Lenchenkov, Sunnyvale, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 131 days.

(21) Appl. No.: 13/964,462

(22) Filed: Aug. 12, 2013

(65) Prior Publication Data
US 2014/0077283 A1    Mar. 20, 2014

Related U.S. Application Data

(60) Provisional application No. 61/703,689, filed on Sep. 20, 2012.

(51) Int. Cl.
*H01L 31/00* (2006.01)
*H01L 27/146* (2006.01)

(52) U.S. Cl.
CPC .... *H01L 27/14643* (2013.01); *H01L 27/14609* (2013.01); *H01L 27/14623* (2013.01); *H01L 27/14627* (2013.01); *H01L 27/14629* (2013.01)

(58) Field of Classification Search
CPC .................. H01L 27/14643; H01L 27/14623; H01L 27/1462; H01L 27/14641; H01L 31/0232; H01L 31/02327; H01L 31/02164
USPC .................................................. 257/294, 292
See application file for complete search history.

(56) References Cited

U.S. PATENT DOCUMENTS

| | | | |
|---|---|---|---|
| 5,432,363 A | 7/1995 | Kamisaka et al. | |
| 7,075,164 B2* | 7/2006 | Uya | 257/431 |
| 7,453,131 B2 | 11/2008 | Marshall et al. | |
| 7,935,994 B2 | 5/2011 | Wang et al. | |
| 8,383,440 B2 | 2/2013 | Wang et al. | |
| 8,558,335 B2* | 10/2013 | Nagano | 257/431 |
| 2007/0034981 A1* | 2/2007 | Saito | 257/462 |
| 2010/0078744 A1* | 4/2010 | Wano et al. | 257/432 |
| 2011/0242376 A1* | 10/2011 | Ando | 348/294 |
| 2012/0112254 A1* | 5/2012 | Nagano | 257/292 |
| 2013/0001724 A1* | 1/2013 | Masuda | 257/432 |
| 2013/0200251 A1* | 8/2013 | Velichko | 250/208.1 |
| 2014/0077061 A1* | 3/2014 | Lenchenkov | 250/208.1 |
| 2014/0078359 A1* | 3/2014 | Lenchenkov et al. | 348/294 |
| 2014/0085517 A1* | 3/2014 | Lenchenkov et al. | 348/294 |

OTHER PUBLICATIONS

Agranov et al., U.S. Appl. No. 13/860,157, filed Apr. 10, 2013.

* cited by examiner

*Primary Examiner* — Victor A Mandala
(74) *Attorney, Agent, or Firm* — Treyz Law Group; Jason Tsai

(57) ABSTRACT

An image sensor with an array of image sensor pixels is provided. Each image pixel may include a photodiode and associated pixel circuits formed in a semiconductor substrate. Buried light shielding structures may be formed on the substrate to prevent pixel circuitry that is formed in the substrate between two adjacent photodiodes from being exposed to incoming light. The buried light shielding structures may be lined with absorptive antireflective coating material to prevent light from being reflected off the surface of the buried light shielding structures. Forming buried light shielding structures with absorptive antireflective coating material can help reduce optical pixel crosstalk and enhance global shutter efficiency.

20 Claims, 4 Drawing Sheets

IMAGE SENSORS HAVING BURIED LIGHT SHIELDS WITH ANTIREFLECTIVE COATING

This application claims the benefit of provisional patent application No. 61/703,689, filed Sep. 20, 2012, which is hereby incorporated by reference herein in its entirety.

BACKGROUND

This relates generally to image sensors, and more specifically, to image sensors with buried light shields.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include an array of image sensor pixels each of which includes a photodiode and other operational circuitry such as transistors formed in the substrate.

A dielectric stack is formed on the substrate over the photodiodes. The dielectric stack includes metal routing lines and metal vias formed in dielectric material. Light guides are often formed in the dielectric stack to guide the trajectory of incoming light. A color filter array is typically formed over the dielectric stack to provide each pixel with sensitivity to a certain range of wavelengths. Microlenses are formed over the color filter array. Light enters the microlenses and travels through the color filters into the dielectric stack.

In a conventional image sensor configured to operate in global shutter mode, each image sensor pixel includes a photodiode for detecting incoming light and a separate storage diode for temporarily storing charge. The storage diode should not be exposed to incoming light. In such arrangements, structures such as tungsten buried light shields (abbreviated as WBLS) are formed on the substrate between neighboring photodiodes to help prevent stray light from affecting the storage diode. At least some metal vias are formed through gaps in the buried light shields in order to control pixel transistors formed between two adjacent photodiodes. Shielding storage diodes in this way can help reduce crosstalk and increase global shutter efficiency (i.e., the buried light shields are designed to prevent stray light from entering regions of the substrate located between two adjacent photodiodes).

In practice, however, the tungsten buried light shield reflects stray light. The reflected stray light may then strike nearby metal routing structures and be scattered back towards the substrate, through the existing gaps in the buried light shield, and corrupt the storage diode. This results in undesirable pixel crosstalk and degraded global shutter efficiency.

It would therefore be desirable to be able to provide image sensors with improved inter-pixel shielding arrangements.

DETAILED DESCRIPTION

Embodiments of the present invention relate to image sensors, and more particularly, to image sensors with buried light shield structures with antireflective coating. It will be recognized by one skilled in the art, that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices include image sensors that gather incoming light to capture an image. The image sensors may include arrays of imaging pixels. The pixels in the image sensors may include photosensitive elements such as photodiodes that convert the incoming light into image signals. Image sensors may have any number of pixels (e.g., hundreds or thousands of pixels or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
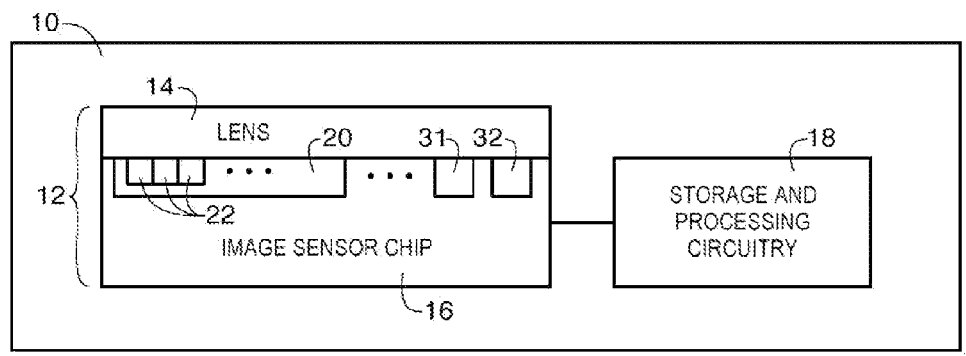
FIG. 1 is a diagram of an illustrative electronic device in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor system-on-chip (SOC) having additional processing and control circuitry such as analog control circuitry 31 and digital control circuitry 32 on a common image sensor integrated circuit die with image pixel array 20 or on a separate companion die/chip.

During image capture operations, light from a scene may be focused onto an image pixel array (e.g., array 20 of image pixels 22) by lens 14. Image sensor 16 provides corresponding digital image data to analog circuitry 31. Analog circuitry 31 may provide processed image data to digital circuitry 32 for further processing. Circuitry 31 and/or 32 may also be used in controlling the operation of image sensor 16. Image sensor 16 may, for example, be a backside illumination image sensor. If desired, camera module 12 may be provided with an array of lenses 14 and an array of corresponding image sensors 16.

Device 10 may include additional control circuitry such as storage and processing circuitry 18. Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18.

Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices.

Embodiments of the present invention relate to image sensor pixels configured to support global shutter operation. For example, the image pixels may each include a photodiode, floating diffusion region, and a local storage region. With a global shutter scheme, all of the pixels in an image sensor are reset simultaneously. The transfer operation is then used to simultaneously transfer the charge collected in the photodiode of each image pixel to the associated storage region. Data from each storage region may then be read out on a per-row basis.

Figure 2:
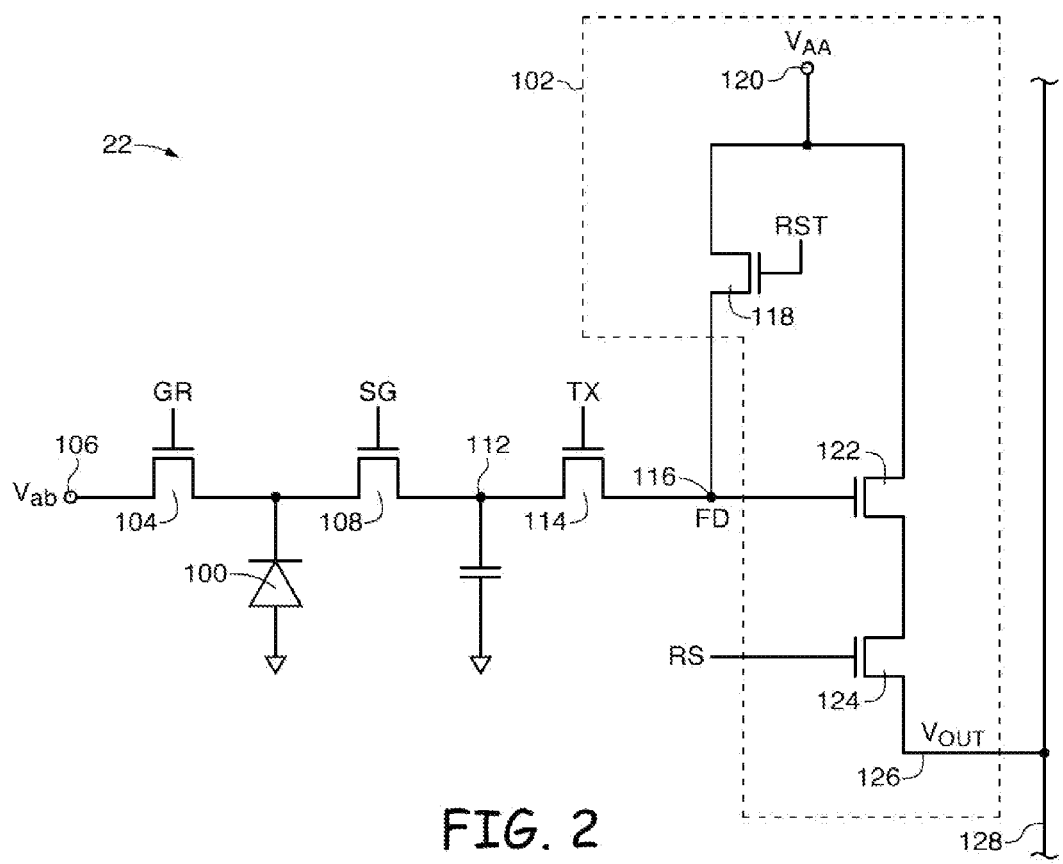
FIG. 2 is a diagram of an illustrative image sensor pixel that may be used to support global shutter operation in accordance with an embodiment of the present invention.

FIG. 2 is a circuit diagram of an illustrative image sensor pixel 22 operable in global shutter mode. As shown in FIG. 2, pixel 22 may include a photosensitive element such as photodiode 100. A first (positive) power supply voltage Vaa may be supplied at positive power supply terminal 120. A second power supply voltage Vab may be supplied at second power supply terminal 106. Incoming light may be collected by photodiode 100. Photodiode 100 may then generate charge (e.g., electrons) in response to receiving impinging photons. The amount of charge that is collected by photodiode 100 may depend on the intensity of the impinging light and the exposure duration (or integration time).

Before an image is acquired, reset control signal RST may be asserted. Asserting signal RST turns on reset transistor 118 and resets charge storage node 116 (also referred to as floating diffusion region FD) to Vaa. Reset control signal RST may then be deasserted to turn off reset transistor 118. Similarly, prior to charge integration, a global reset signal GR may be pulsed high to reset photodiode 100 to power supply voltage Vab (e.g., by passing Vab to photodiode 100 through global reset transistor 104).

Pixel 22 may further include a storage transistor 108 operable to transfer charge from photodiode 100 to storage node (sometimes called a charge storage region or storage region) 112. Charge storage region 112 may be a doped semiconductor region (e.g., a doped silicon region formed in a silicon substrate by ion implantation, impurity diffusion, or other doping techniques) that is capable of temporarily storing charge transferred from photodiode 100. Region 112 that is capable of temporarily storing transferred charge is sometimes referred to as a "storage diode" (SD).

Pixel 22 may include a transfer gate (transistor) 114. Transfer gate 114 may have a gate terminal that is controlled by transfer control signal TX. Transfer signal TX may be pulsed high to transfer charge from storage diode region 112 to charge storage region 116 (sometimes called a floating diffusion region). Floating diffusion (FD) region 116 may be a doped semiconductor region (e.g., a region in a silicon substrate that is doped by ion implantation, impurity diffusion, or other doping processes). Floating diffusion region 116 may serve as another storage region for storing charge during image data gathering operations.

Pixel 22 may also include readout circuitry such as charge readout circuit 102. Charge readout circuit 102 may include row-select transistor 124 and source-follower transistor 122. Transistor 124 may have a gate that is controlled by row select signal RS. When signal RS is asserted, transistor 124 is turned on and a corresponding signal Vout (e.g. an output signal having a magnitude that is proportional to the amount of charge at floating diffusion node 116), is passed onto output path 128.

Image pixel array 20 may include pixels 22 arranged in rows and columns. A column readout path such as output line 128 may be associated with each column of pixels (e.g., each image pixel 22 in a column may be coupled to output line 128 through respective row-select transistors 124). Signal RS may be asserted to read out signal Vout from a selected image pixel onto column readout path 124. Image data Vout may be fed to processing circuitry 18 for further processing. The circuitry of FIG. 2 is merely illustrative. If desired, pixel 22 may include other pixel circuitry.

Figure 3:
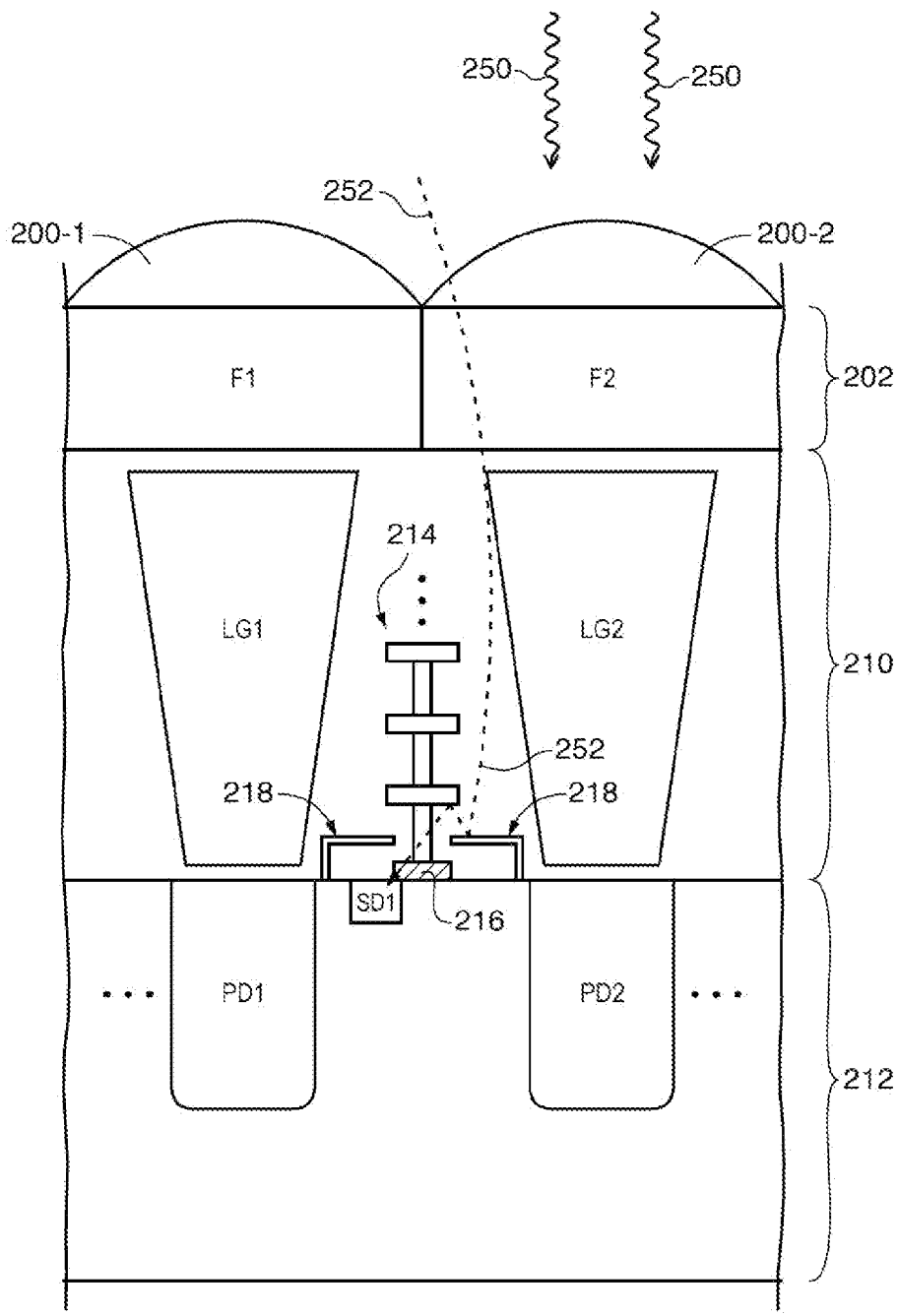
FIG. 3 is a cross-sectional side view of a conventional image sensor with reflective buried light shields.

FIG. 3 is a cross-sectional side view showing two adjacent conventional image sensor pixels operable in global shutter mode. As shown in FIG. 3, photodiode PD1 that is part of a first image sensor pixel and photodiode PD2 that is part of a second image sensor pixel are formed in a p-type substrate 212. Circuitry such as a storage diode SD1 and a storage gate conductor 216 (i.e., a gate conductor of the storage transistor) that is associated with the first image pixel may be formed on substrate 212 between photodiodes PD1 and PD2.

A dielectric stack 210 is formed on substrate 212. A first light guide LG1 for directing incoming light towards PD1 is formed above PD1 in dielectric stack 210. A second light guide LG2 for directing incoming light towards PD2 is formed above PD2 in dielectric stack 210. Metal interconnect routing paths 214 are formed in dielectric stack 210 between light guides LG1 and LG2. At least some metal routing path makes contact with storage gate conductor 216 for controlling the storage transistor.

A color filter array 202 is formed over dielectric stack 210. In particular, a first filter element F1 is formed on stack 210 directly above PD1, whereas a second filter element F2 is formed on stack 210 directly above PD2. First filter element F1 may be configured to pass green light, whereas second filter element F2 may be configured to pass red light. A first microlens 200-1 that is configured to focus light towards PD1 can be formed on first filter element F1, whereas a second microlens 200-2 that is configured to focus light towards PD2 can be formed on second filter element F2.

Ideally, incoming light 250 enters microlenses 200-1 and 200-2 from above and is directed towards the corresponding photodiodes. For example, light entering microlens 200-1 should be directed towards PD1, whereas light entering microlens 200-2 should be directed towards PD2. In practice, however, stray light may potentially strike regions on substrate 212 between adjacent photodiodes and result in undesired crosstalk and reduction in global shutter efficiency (i.e., stray light may undesirably affect the amount of charge in storage diode region SD1). Regions on substrate 212 where light should not be allowed to strike may be referred to as "dark" regions.

In an effort to prevent stray light from entering the dark regions, tungsten buried light shields 218 are formed to partially cover the dark regions (i.e., light shields 218 are designed to shield SD1 and storage gate 216). There may be gaps in the buried light shields through which interconnects 214 are formed to make contact with circuitry in the dark regions.

Tungsten buried light shields 218 are reflective. In practice, stray light may reflect off the tungsten buried light shields 218; the reflected light may strike nearby interconnect routing structures 214 and be scattered through the gaps in the light shields into the dark regions (as indicated by path 252). Even though the tungsten buried light shields help to reduce crosstalk, stray light can still be inadvertently scattered into the dark regions on substrate 212. It may therefore be desirable to provide improved ways for shielding the dark regions.

Figure 4:
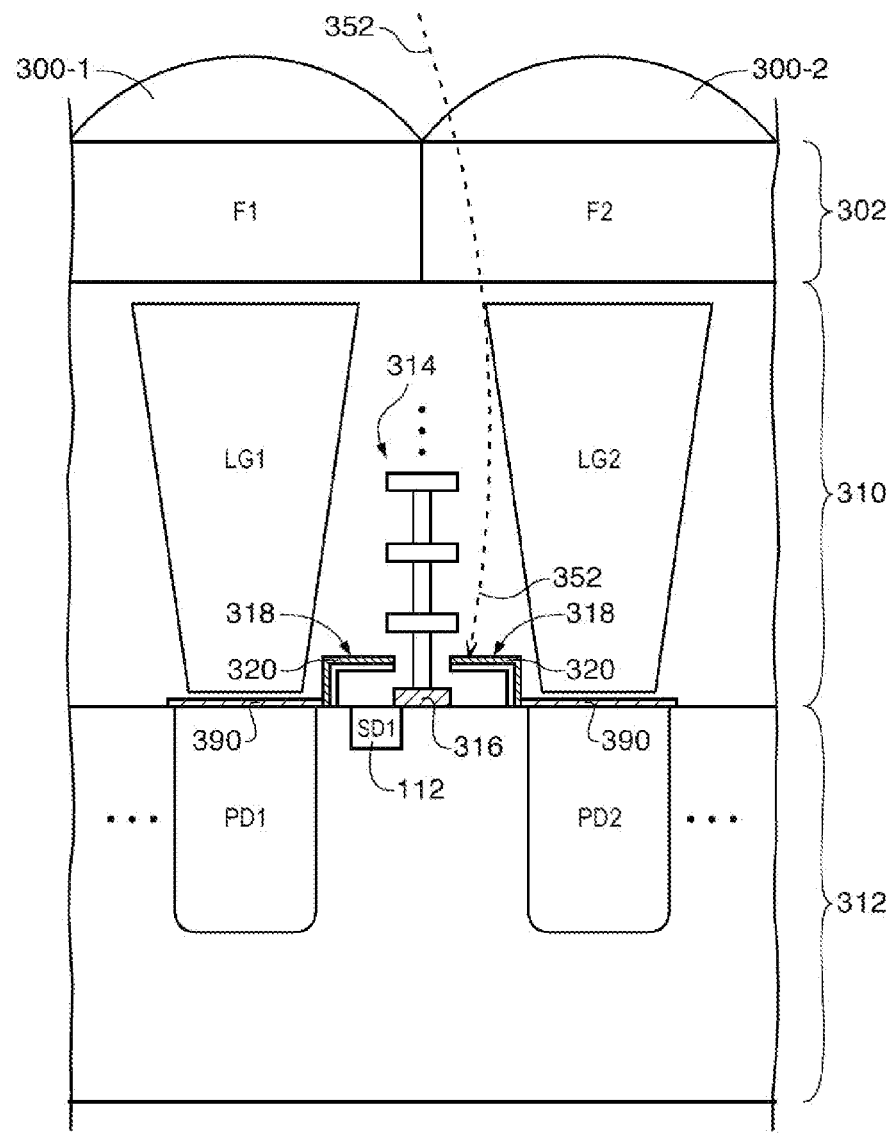
FIG. 4 is a cross-sectional side view of an illustrative image sensor that includes buried light shield structures with antireflective coating in accordance with an embodiment of the present invention.

In accordance with an embodiment of the present invention, image sensor pixels may be provided with buried light shield structures having antireflective coating (see, e.g., FIG. 4). FIG. 4 shows two adjacent image pixels in array 20. As shown in FIG. 4, a first photosensitive element such as photodiode PD1 that is associated with a first pixel 22 and a second photosensitive element such as photodiode PD2 that is associated with a second pixel 22 may be formed in a semiconductor substrate such as substrate 312 (e.g., a p-type semiconductor substrate). Pixel circuitry such as storage diode SD1, storage gate conductor 316 (e.g., a gate conductor associated with storage transistor 108 or other control transistor in pixel 22), floating diffusion region FD, and other pixel structures may be formed in a region of substrate 312 between PD1 and PD2.

A dielectric stack such as dielectric stack 310 may be formed on substrate 312. Dielectric stack 310 may be formed from dielectric material such as silicon oxide. A first light guide LG1 that is used to direct light toward PD1 may be formed in dielectric stack 310 above PD1. A second light guide LG2 that is used to direct light toward PD2 may be formed in dielectric stack 310 above PD2. Interconnect routing structures 314 (e.g., conductive signal routing paths and conductive vias) may be formed in dielectric stack 310 between light guides LG1 and LG2. Dielectric stack 310 may therefore sometimes be referred to as an interconnect stack.

A color filter array such as color filter array structure 302 may be formed on top of dielectric stack 310. In the example of FIG. 4, a first color filter element F1 may be formed on stack 310 above LG1, and a second color filter element F2 may be formed on stack 310 above LG2. Filter element F1 may serve to pass light in a first portion of the visible spectrum, whereas filter element F2 may serve to pass light in a second portion of the visible spectrum that is different than the first portion. Color filter elements F1 and F2 may each be configured to pass through a selected one of: green light, red light, blue light, cyan light, magenta light, yellow light, and/or other types of light.

A microlens array may be formed on top of color filter array 302. The microlens array may include a first microlens 300-1 formed on top of first color filter element F1 and a second microlens 300-2 formed on top of second color filter element F2. Microlens 300-1 may be used to focus light towards PD1, whereas microlens 300-2 may be used to focus light towards PD2.

Light shielding structures such as buried light shielding (BLS) structures 318 may be formed on substrate 312 to prevent stray light from entering regions on substrate 312 located between adjacent photodiodes (e.g., structures 318 may be configured to prevent pixel structures such as storage diode region 112 from being exposed to incoming light). Buried light shielding structures 318 may be formed from tungsten, copper, gold, silver, aluminum, or other suitable conductive material.

To prevent stray light be being reflected off the surface of the buried light shielding structures, the buried light shielding structures may be coated with antireflective coating (ARC) material. For example, buried light shield structures 318 may be lined with a 55 nm thick layer of silicon nitride 320. Silicon nitride liner 320 may have an index of refraction having a real component n that is equal to 2.1 and an imaginary component k that is equal to 0.3. Coating structures 318 with such type of ARC material can help absorb any stray light in the 400-650 nm wavelength range and prevent light in that range from reflecting off the surface of structures 318 (as indicated by light path 352), thereby substantially reducing optical pixel crosstalk and increasing global shutter efficiency. Liner 320 formed in this way can sometimes be referred to as an "absorptive" antireflective layer.

The example of using silicon nitride in the ARC liner is merely illustrative and does not serve to limit the scope of the present invention. Consider a scenario in which dielectric stack 310 is formed from a material with refractive index n1 and in which buried light shielding structures is formed from a material with refractive index n2. In particular, ARC liner 320 may be any material having a refractive index that is between n1 and n2. For example, liner 320 may exhibit a refractive index that is equal to the geometric mean of n1 and n2. As another example, liner 320 may exhibit an index of refraction that is greater than n1 and less than n2. In general, the refractive index values vary as a function of wavelength. The choice of ARC material may therefore depend on the particular wavelength of light that should be attenuated.

In certain embodiments, antireflective material such as ARC liner 390 may also be formed over the photodiodes (see, FIG. 4). Liner 390 formed at the interface between stack 310 (formed from silicon oxide) and substrate 312 (formed from crystalline silicon) may generally be formed from different materials as that of ARC liner 320. If desired, liners 320 and 390 may be formed from the same material. Forming absorptive liners over the photodiodes and on top of the buried light shielding structures may help prevent light from being reflected off the surface of substrate 312 at undesired angles, thereby drastically reducing optical pixel crosstalk.

Figure 5:
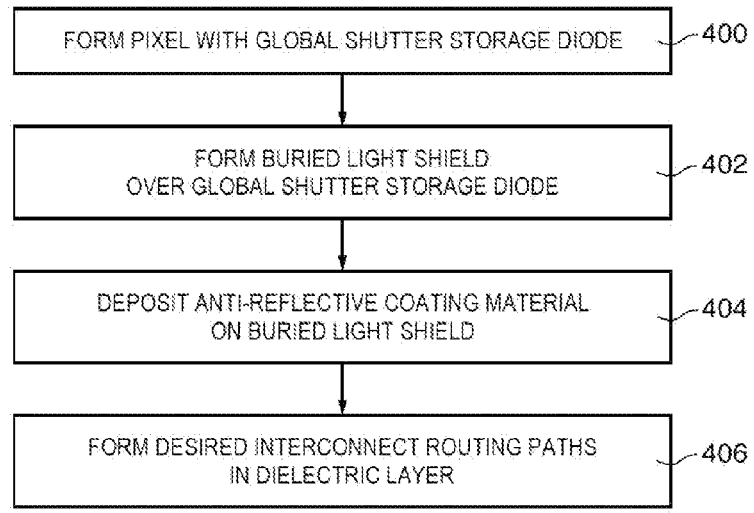
FIG. 5 is a flowchart of illustrative steps involved in forming buried light shield structures with antireflective coating in accordance with an embodiment of the present invention.

FIG. 5 is a flow chart of illustrative steps involved in forming the pixel structure of FIG. 4. At step 400, an image pixel having global shutter storage diode region 112 and other pixel circuitry (e.g., photodiode 100, floating diffusion region 116, and transistors 104, 108, 114, 118, 122, and 124) may be formed in a semiconductor substrate). At step 402, buried light shield structures may be formed over the storage diode region to prevent the storage diode region, floating diffusion region, and other pixel circuitry from being inadvertently exposed to stray light.

At step 404, antireflective coating material may be selectively deposited on the buried light shield structures. For example, a layer of silicon nitride may be formed to cover the upper surface of the buried light shields. In general, sputtering, other types of physical vapor deposition, or other types of deposition techniques (e.g., chemical vapor deposition, electrochemical deposition, ink-jet patterning, pad printing, spinning, spraying, etc.) may be used in depositing the ARC material over the buried light shields. As described in connection with FIG. 4, different ARC material may be optionally formed over the photodiodes in a separate deposition operation.

At step 406, a dielectric stack including any interconnect routing structures and light guides may be formed over the semiconductor substrate. Other pixel structures such as a color filter array and a microlens array may subsequently be formed over the dielectric stack. Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The embodiment described thus far relates to image sensors operating in global shutter mode. If desired, the embodiments of the present invention can also be applied to image sensors operating in rolling shutter mode to help reduce optical pixel cross-talk.

Figure 6:
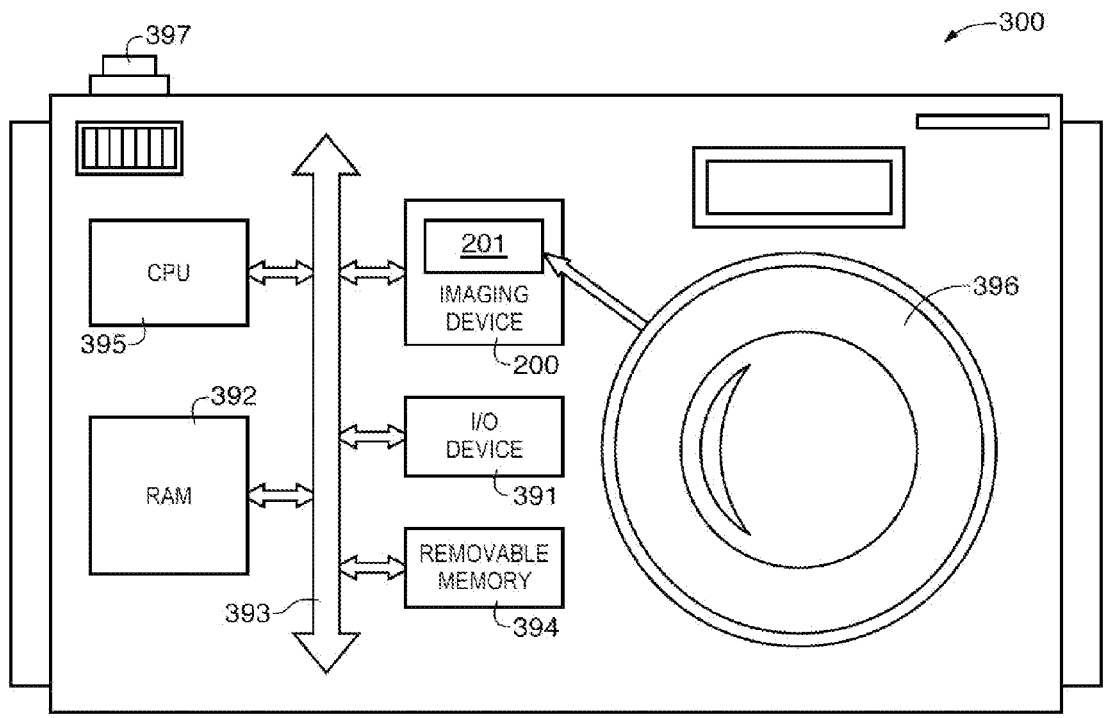
FIG. 6 is a block diagram of a processor system that may employ some of the embodiments of FIGS. 4 and 5 in accordance with an embodiment of the present invention.

FIG. 6 shows in simplified form a typical processor system 300, such as a digital camera, which includes an imaging device 200 (e.g., an imaging device 200 such as imaging sensor 16 that includes buried light shielding structures with absorptive antireflective coating described in FIG. 4). The processor system 300 is exemplary of a system having digital circuits that could include imaging device 200. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The processor system 300, for example a digital still or video camera system, generally includes a lens 396 for focusing an image on pixel array 100 when a shutter release button 397 is pressed, central processing unit (CPU) 395, such as a microprocessor which controls camera and one or more image flow functions, which communicates with one or more input/output (I/O) devices 391 over a bus 393. Imaging device 2000 also communicates with the CPU 395 over bus 393. The system 300 also includes random access memory (RAM) 392 and can include removable memory 394, such as flash memory, which also communicates with CPU 395 over the bus 393. Imaging device 2000 may be combined with the CPU, with or without memory storage on a single integrated circuit or on a different chip. Although bus 393 is illustrated as a single bus, it may be one or more busses or bridges or other communication paths used to interconnect the system components.

Various embodiments have been described illustrating imaging systems with buried light shield structures. A system may include an image sensor module with an array of image sensor pixels and one or more lenses that focus light onto the array of image sensor pixels (e.g., image pixels arranged in rows and columns).

In particular, first and second neighboring photodiodes may be formed in a semiconductor substrate. Buried light shield structures such as light shielding structures made from tungsten may be formed on the substrate between the first and second photodiodes. Absorptive antireflective coating material (e.g., a layer of silicon nitride) may be deposited on the buried light shield structures.

The buried light shield structures may be used to prevent pixel circuits such as storage diode regions formed in the substrate between adjacent photodiodes from being exposed to incoming (stray) light. A dielectric stack may be formed on the substrate. Conductive interconnect routing structures such as signal routing paths and conductive vias may be formed in the dielectric stack and may contact some of the pixel circuits via gaps in the buried light shield structures.

The dielectric stack may include dielectric material (e.g., silicon oxide) having a first refractive index. The buried light shield structures may have a second refractive index. The absorptive antireflective coating material may have a third refractive index that is between the first and second refractive indices (e.g., the third refractive index may be greater than the first refractive index and may be less than the second refractive index). If desired, an antireflective coating liner having a refractive index that is different from the third refractive index may be selectively formed over the photodiodes.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
    a substrate;
    first and second neighboring photodiodes formed in the substrate; and
    buried light shield structures formed on the substrate between the first and second photodiodes, wherein the buried light shield structures are lined with absorptive antireflective coating material.

2. The image sensor defined in claim 1, further comprising:
    a storage diode formed in the substrate directly below the buried light shield structures.

3. The image sensor defined in claim 2, further comprising:
    a transistor coupled between the storage diode and the first photodiode.

4. The image sensor defined in claim 3, further comprising:
    a dielectric stack formed on top of the substrate; and
    conductive interconnect routing structures that is formed in the dielectric stack and that is coupled to the transistor via a gap in the buried light shield structures.

5. The image sensor defined in claim 1, further comprising:
    an antireflective coating liner formed on the substrate directly over the first and second photodiodes.

6. The image sensor defined in claim 5, wherein the antireflective coating liner and the absorptive antireflective coating material on the buried light shield structures are formed from different materials.

7. The image sensor defined in claim 1, wherein the absorptive antireflective coating material comprises silicon nitride.

8. The image sensor defined in claim 1, wherein the buried light shield structures are formed from tungsten.

9. A method of manufacturing an image sensor, comprising:
    forming first and second adjacent photodiodes in a substrate;
    forming light shielding structures on the substrate between the first and second photodiodes; and
    forming a layer of antireflective coating material on the light shielding structures.

10. The method defined in claim 9, further comprising:
    forming a storage diode associated with the first photodiode in the substrate directly under the light shielding structures.

11. The method defined in claim 10, further comprising:
    forming a transistor in the substrate, wherein the transistor is coupled between the storage diode and the first photodiode.

12. The method defined in claim 9, wherein forming the layer of antireflective coating material comprises forming a layer of silicon nitride on the light shielding structures.

13. The method defined in claim 9, further comprising:
    forming a dielectric stack on the substrate, wherein the dielectric stack has a first refractive index, wherein the light shielding structures has a second refractive index, and wherein the layer of antireflective coating material has a third refractive index that is between the first and second refractive indices.

14. The method defined in claim 9, further comprising:
    forming a layer of antireflective coating material on the first and second photodiodes, wherein the layer of antireflective coating material on the photodiodes and the layer of antireflective coating material on the light shielding structures are formed from different materials.

15. The method defined in claim 9, wherein forming the layer of antireflective coating material on the light shielding structures comprises selectively depositing the layer of antireflective coating material on the light shielding structures via a selected one of physical vapor deposition, chemical vapor deposition, and electrochemical deposition.

16. A system, comprising:
   a central processing unit;
   memory;
   a lens;
   input-output circuitry; and
   an imaging device, wherein the imaging device comprises:
      an image sensor having a plurality of image sensor pixels, wherein each image sensor pixel in the plurality of image sensor pixels includes buried light shield structures on which absorptive antireflective coating material is formed.

17. The system defined in claim 16, wherein the buried light shield structures are formed from tungsten, and wherein the absorptive antireflective coating material is formed from silicon nitride.

18. The system defined in claim 16, wherein the buried light shield structures are formed between adjacent image sensor pixels in the plurality of image sensor pixels.

19. The system defined in claim 16, wherein the buried light shield structures are formed from reflective material having a first index of refraction, and wherein the absorptive antireflective coating material has a second index of refraction that is less than the first index of refraction.

20. The system defined in claim 19, wherein silicon oxide has a third index of refraction, and wherein second index of refraction associated with the absorptive antireflective coating material is greater than the third index of refraction.

* * * * *